(12) United States Patent
Lin et al.

(10) Patent No.: US 7,935,570 B2
(45) Date of Patent: May 3, 2011

(54) SEMICONDUCTOR DEVICE AND METHOD OF EMBEDDING INTEGRATED PASSIVE DEVICES INTO THE PACKAGE ELECTRICALLY INTERCONNECTED USING CONDUCTIVE PILLARS

(75) Inventors: Yaojian Lin, Singapore (SG); Jianmin Fang, Singapore (SG); Kang Chen, Singapore (SG); Haijing Cao, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 5 days.

(21) Appl. No.: 12/331,698

(22) Filed: Dec. 10, 2008

(65) Prior Publication Data
US 2010/0140736 A1 Jun. 10, 2010

(51) Int. Cl.
*H01L 21/00* (2006.01)

(52) U.S. Cl. ......... 438/107; 438/15; 438/25; 438/26; 438/106; 438/109; 438/111; 438/112; 438/126; 438/127; 257/686; 257/723; 257/E33.26; 257/E33.258; 257/E21.499

(58) Field of Classification Search ............... 438/15, 438/25, 26, 106, 107, 109, 111, 112, 126, 438/127; 257/686, 723, E33.26, E33.258, 257/E21.499
See application file for complete search history.

(56) References Cited

U.S. PATENT DOCUMENTS

| | | | |
|---|---|---|---|
| 4,764,799 A * | 8/1988 | Malaviya | 257/514 |
| 5,250,843 A | 10/1993 | Eichelberger | |
| 5,353,498 A | 10/1994 | Fillion et al. | |
| 5,841,193 A | 11/1998 | Eichelberger | |
| 7,619,901 B2 | 11/2009 | Eichelberger et al. | |
| 2006/0255458 A1 | 11/2006 | Dangelmaier | |
| 2007/0114634 A1 * | 5/2007 | Lin et al. | 257/528 |
| 2007/0114651 A1 * | 5/2007 | Marimuthu et al. | 257/690 |
| 2008/0017907 A1 * | 1/2008 | Otremba | 257/306 |
| 2008/0029890 A1 * | 2/2008 | Cheng | 257/739 |
| 2008/0237834 A1 * | 10/2008 | Hu et al. | 257/693 |
| 2008/0296697 A1 * | 12/2008 | Hsu et al. | 257/379 |
| 2009/0206461 A1 * | 8/2009 | Yoon | 257/686 |

* cited by examiner

*Primary Examiner* — Evan Pert
*Assistant Examiner* — Hajar Kolahdouzan
(74) *Attorney, Agent, or Firm* — Robert D. Atkins; Patent Law Group

(57) ABSTRACT

A semiconductor device has a first insulation layer formed over a sacrificial substrate. A first conductive layer is formed over the first insulating layer. Conductive pillars are formed over the first conductive layer. A pre-fabricated IPD is disposed between the conductive pillars. An encapsulant is formed around the IPD and conductive pillars. A second insulation layer is formed over the encapsulant. The conductive pillars are electrically connected to the first and second conductive layers. The first and second conductive layers each include an inductor. Semiconductor devices are mounted over the first and second insulating layer and electrically connected to the first and second conductive layers, respectively. An interconnect structure is formed over the first and second insulating layers, respectively, and electrically connected to the first and second conductive layers. The sacrificial substrate is removed. The semiconductor devices can be stacked and electrically interconnected through the conductive pillars.

21 Claims, 13 Drawing Sheets

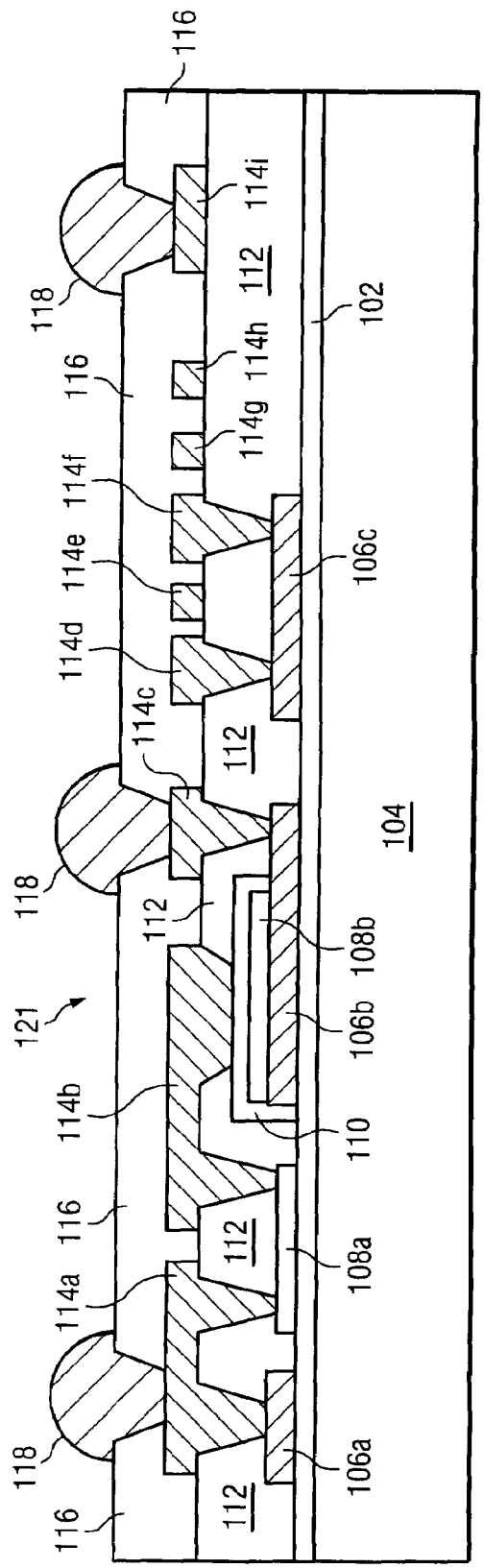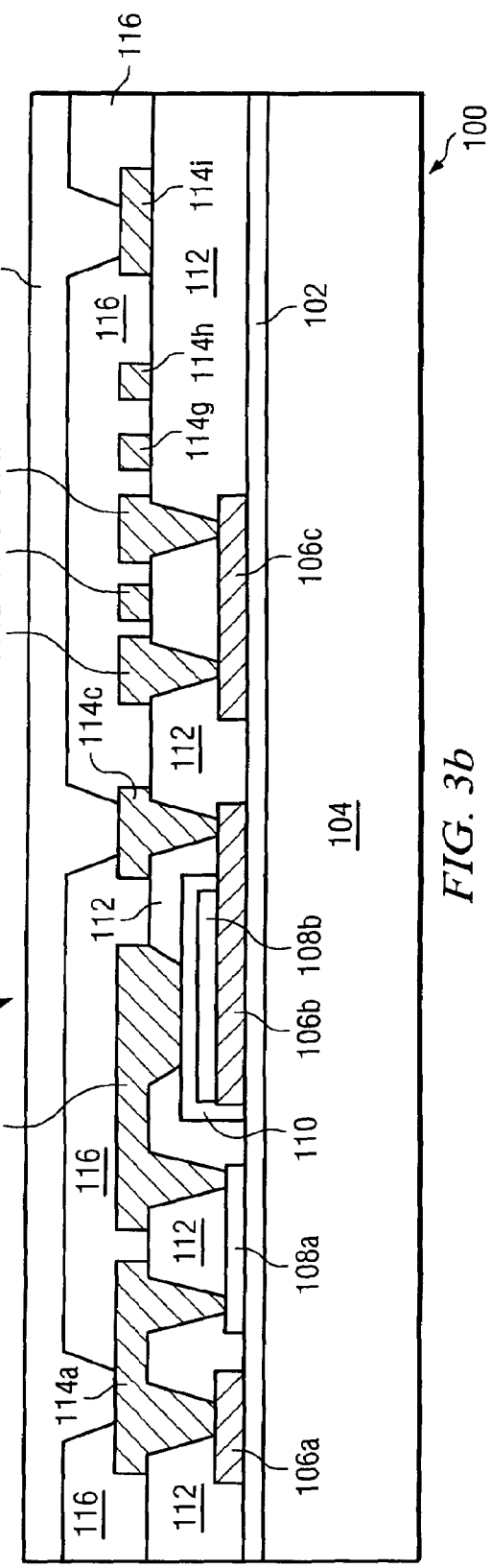

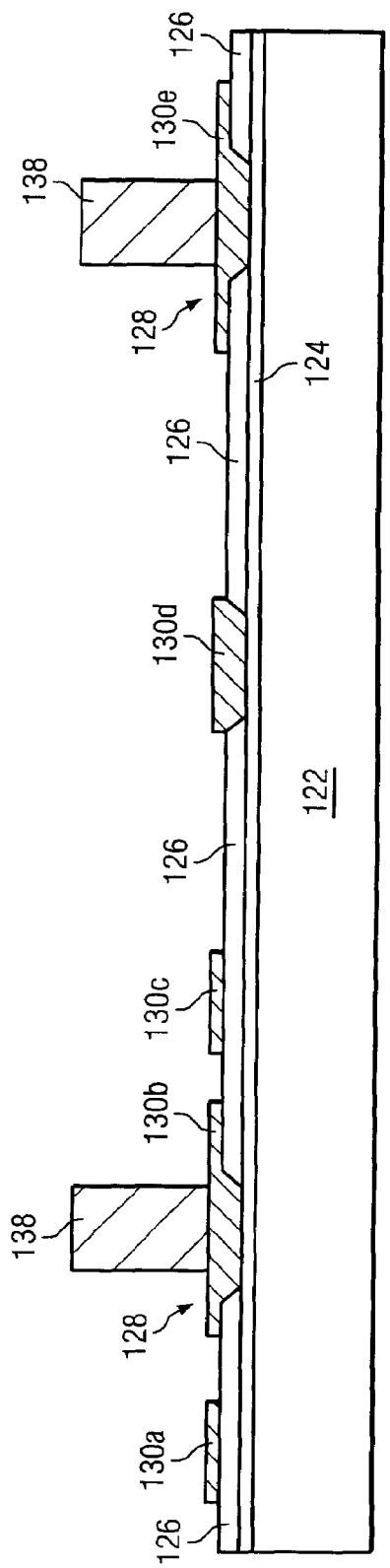
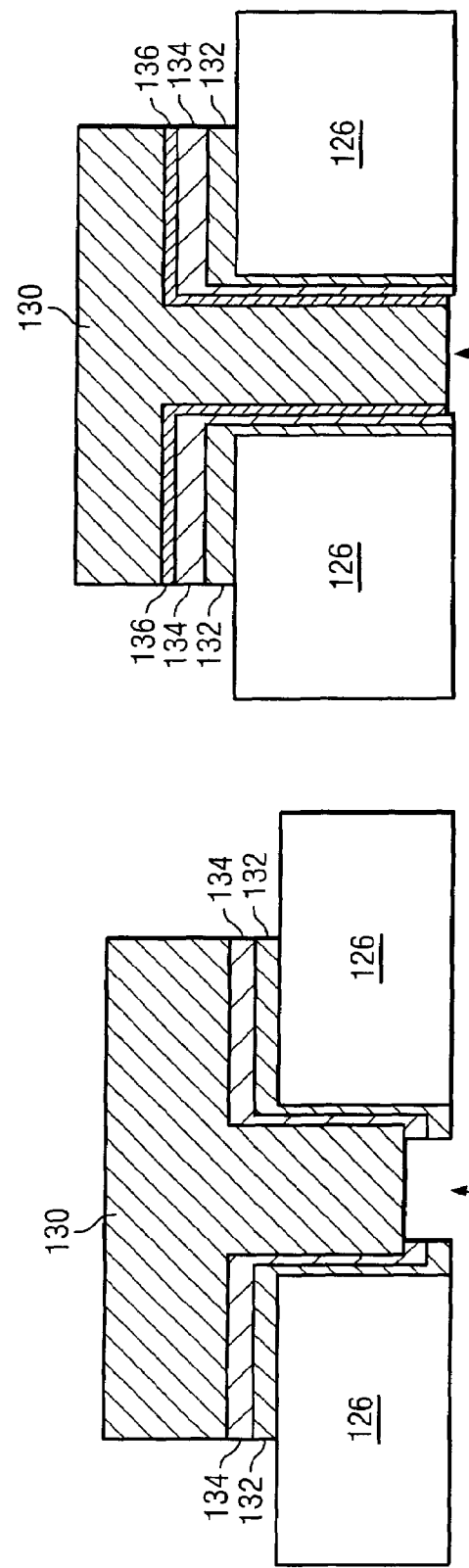
FIG. 4a
FIG. 4b
FIG. 4c

US 7,935,570 B2

SEMICONDUCTOR DEVICE AND METHOD OF EMBEDDING INTEGRATED PASSIVE DEVICES INTO THE PACKAGE ELECTRICALLY INTERCONNECTED USING CONDUCTIVE PILLARS

FIELD OF THE INVENTION

The present invention relates in general to semiconductor devices and, more particularly, to a semiconductor device having an embedded integrated passive device which is electrically interconnected on a semiconductor package using conductive pillars.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk.

In many applications, semiconductor devices combine analog and digital circuitry. Semiconductor devices use one or more inductors and capacitors to implement the device's RF components and to provide system functionality. In some packages, the inductors and capacitors are provided as part of a pre-fabricated IPD that is mounted to the semiconductor device and electrically connected to other components of the semiconductor device. The interconnection between the active and passive devices is typically accomplished using conductive through silicon vias (TSV). TSVs provide electrical interconnection paths vertically through the semiconductor device. However, the use of TSVs adds manufacturing cost and complicates device integration, particularly for thick wafers. In addition, TSV-type semiconductor packages often lack sufficient EMI protection.

SUMMARY OF THE INVENTION

A need exists to electrically interconnect pre-fabricated IPDs with other active and passive devices in the semiconductor package. Accordingly, in one embodiment, the present invention is a method of manufacturing a semiconductor device comprising the steps of providing a pre-fabricated integrated passive device (IPD), providing a sacrificial substrate, forming a first insulation layer over the sacrificial substrate, forming a first conductive layer over the first insulating layer, forming a plurality of conductive pillars over the first conductive layer, attaching the IPD to the first conductive layer between the conductive pillars, forming an encapsulant around the IPD and conductive pillars, forming a second insulation layer over the encapsulant, and forming a second conductive layer over the second insulating layer. The second conductive layer is electrically connected to the conductive pillars. The method further includes the step of removing the sacrificial substrate.

In another embodiment, the present invention is a method of manufacturing a semiconductor device comprising the steps of providing a temporary substrate, forming a first conductive layer over the temporary carrier, forming a plurality of conductive pillars over the first conductive layer, attaching an IPD to the first conductive layer between the conductive pillars, forming an encapsulant around the IPD and conductive pillars, forming a first insulation layer over the encapsulant and conductive pillars, and forming a second conductive layer over the first insulating layer. The second conductive layer is electrically connected to the conductive pillars. The method further includes the step of removing the sacrificial substrate.

In another embodiment, the present invention is a method of manufacturing a semiconductor device comprising the steps of providing a first interconnect structure, and forming a plurality of conductive pillars over the first interconnect structure. The conductive pillars are electrically connected to the first interconnect structure. The method further includes the steps of attaching an IPD to the first interconnect structure between the conductive pillars, and forming an encapsulant around the IPD and conductive pillars.

In another embodiment, the present invention is a semiconductor device comprising a first interconnect structure, and plurality of conductive pillars formed over the first interconnect structure. The conductive pillars are electrically connected to the first interconnect structure. An IPD is disposed between the conductive pillars. An encapsulant is formed around the IPD and conductive pillars.

BRIEF DESCRIPTION OF THE DRAWINGS

FIGS. 2a-2d illustrates further detail of the semiconductor packages mounted to the PCB;

FIGS. 3a-3b illustrate pre-fabrication of an IPD structure;

FIGS. 4a-4e illustrate a process of forming conductive pillars to electrically interconnect the pre-fabricated IPD;

DETAILED DESCRIPTION OF THE DRAWINGS

Figure 1:
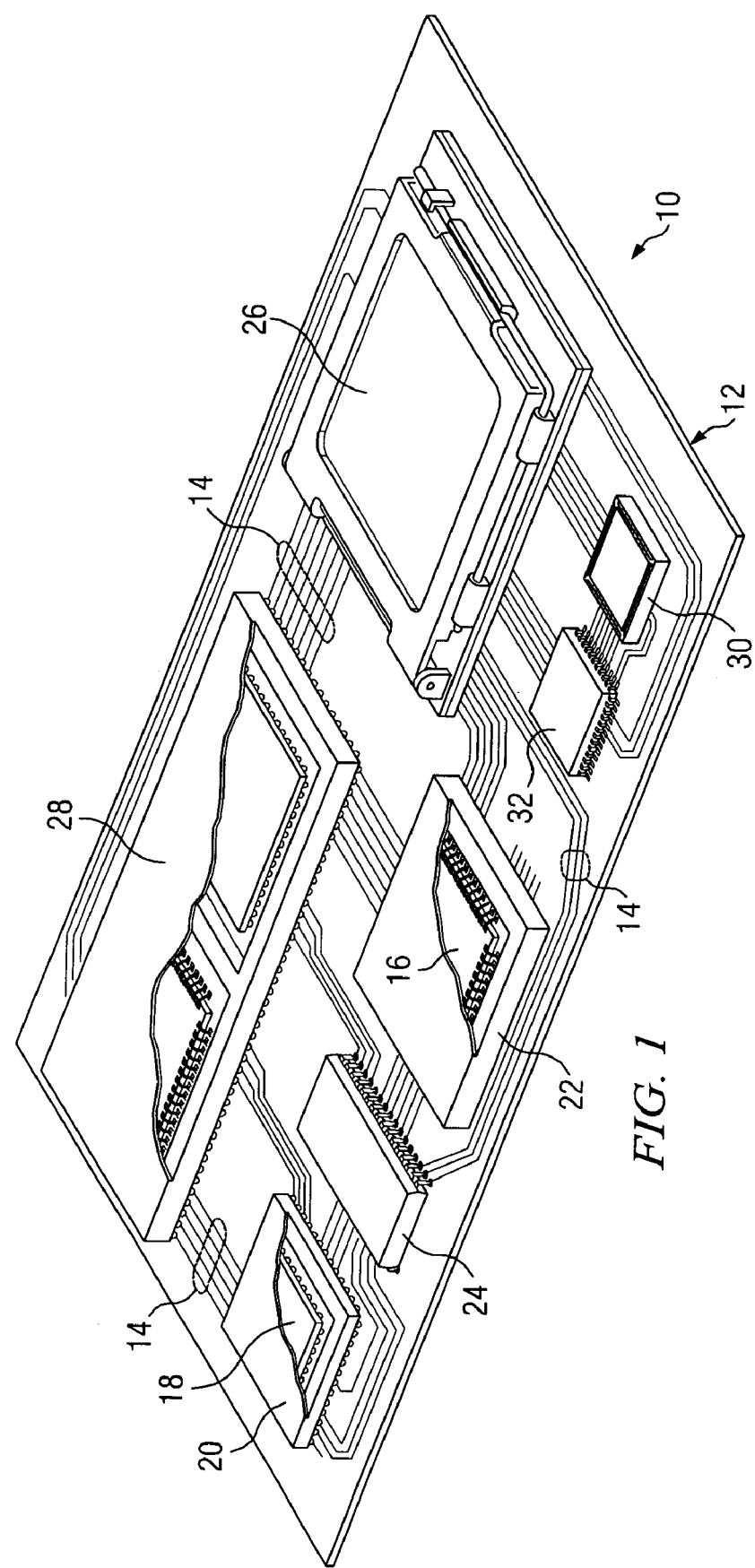
FIG. 1 illustrates a PCB with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
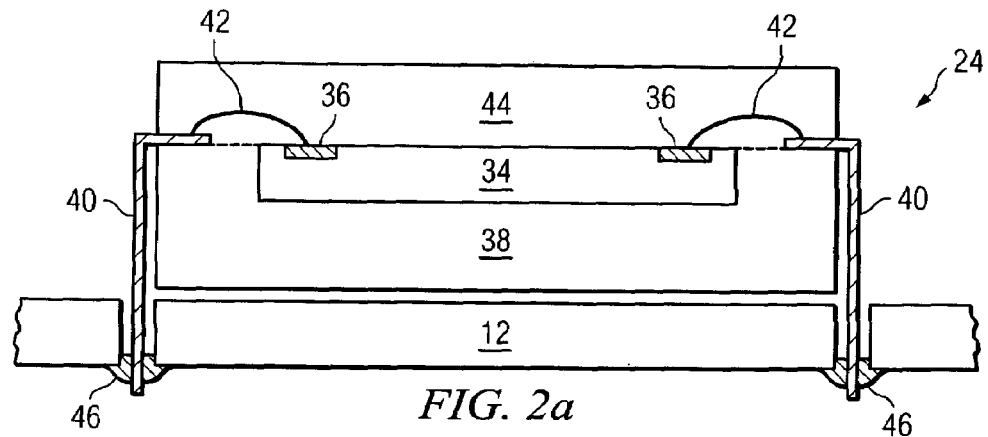

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
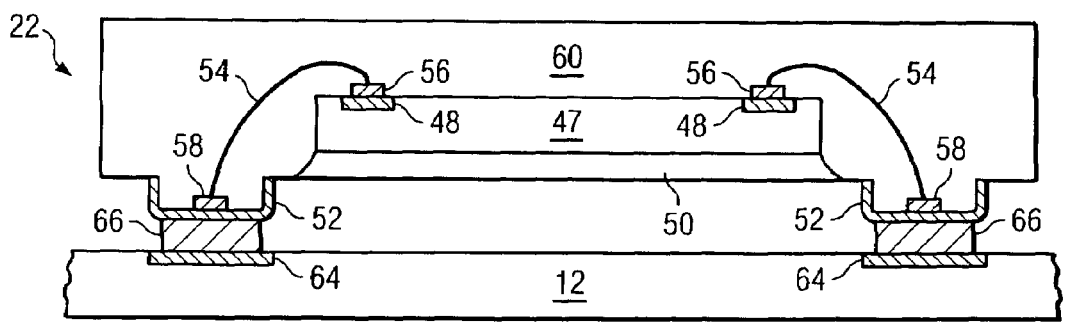

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
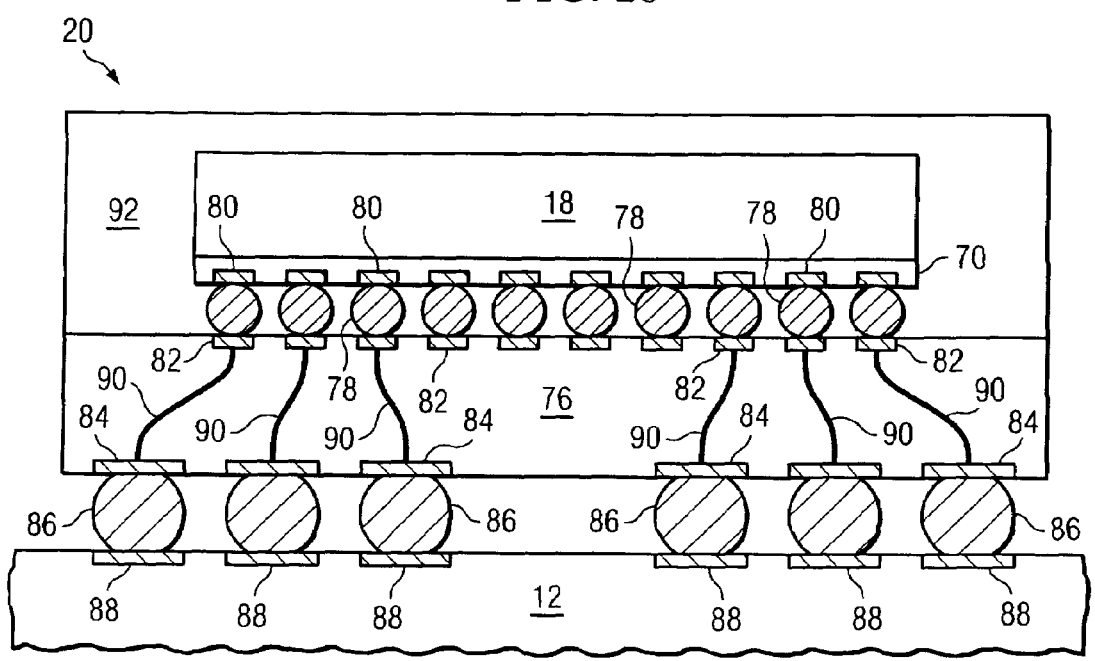

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

FIGS. 3a-3b illustrate a process of forming a prefabricated integrated passive device (IPD). In particular, FIG. 3a shows pre-fabrication of an IPD formed over a high-resistivity substrate. An insulating layer 102 is formed on substrate 104. Substrate 104 is made with a high resistivity silicon, glass, or other similar material. The insulating layer 102 can be silicon dioxide (SiO2), silicon nitride (Si3N4), silicon oxynitride (SiON), tantalum pentoxide (Ta2O5), zircon (ZrO2), aluminum oxide (Al2O3), or other material having suitable insulating properties. The insulating layer 102 is patterned or blanket deposited using PVD, CVD, printing, sintering, or thermal oxidation. The insulating layer 102 can be single or multiple layers.

An electrically conductive layer 106 is patterned and deposited over insulating layer 102 to form individual portions or sections 106a-106c. The individual portions of conductive layer 106 can be electrically common or electrically isolated depending on the connectivity of the individual semiconductor die formed on wafer 100. Conductive layer 106 can be Al, Cu, Sn, Ni, Au, Ag, or other suitable electrically conductive material. The deposition of conductive layer 106 uses PVD, CVD, electrolytic plating, or electroless plating process.

A resistive layer 108 is patterned and deposited on insulating layer 102 and conductive layer 106 using PVD or CVD. Resistive layer 108 has individual portions or sections 108a-108b. Resistive layer 108a is deposited over insulating layer 102 between conductive layers 106a-106b. Resistive layer 108b is deposited over conductive layer 106b. The individual portions of resistive layer 108 can be electrically connected or electrically isolated depending on the connectivity of the individual semiconductor die formed on wafer 100. Resistive layer 108 is tantalum silicide (TaxSiy) or other metal silicides, TaN, nickel chromium (NiCr), TiN, or doped polysilicon having a resistivity between 5 and 100 ohm/sq.

An insulating layer 110 is formed over resistive layer 108b. The insulating layer 110 can be Si3N4, SiO2, SiON, Ta2O5, ZnO, ZrO2, Al2O3, or other suitable dielectric material. The insulating layer 110 is patterned or blanket deposited using PVD, CVD, printing, sintering, or thermal oxidation. Resistive layer 108 and insulating layer 110 are formed with the same mask and etched at the same time. Alternatively, resistive layer 108 and insulating layer 110 can be patterned and etched with a different mask.

An insulating or passivation layer 112 is formed over insulating layer 102, conductive layer 106, resistive layer 108a, and insulating layer 110. The passivation layer 112 can be SiO2, Si3N4, SiON, Ta2O5, Al2O3, polyimide, benzocyclobutene (BCB), polybenzoxazoles (PBO), or other material having suitable insulating properties. The deposition of passivation layer 112 may involve spin coating, PVD, CVD, printing, sintering, or thermal oxidation. A portion of passivation layer 112 is removed to expose conductive layer 106a-106c, insulating layer 110, and resistive layer 108a.

An electrically conductive layer 114 is patterned and deposited over conductive layer 106a-106c, insulating layer 110, resistive layer 108a, and passivation layer 112 to form individual portions or sections 114a-114i. The individual portions of conductive layer 114 can be electrically common or electrically isolated depending on the connectivity of the individual semiconductor die formed on wafer 100. Conductive layer 114 can be Al, Cu, Sn, Ni, Au, Ag, or other suitable electrically conductive material. The deposition of conductive layer 114 uses PVD, CVD, electrolytic plating, or electroless plating process.

An insulating layer 116 is formed over passivation layer 112 and conductive layer 114. The insulating layer 116 can be SiO2, Si3N4, SiON, Ta2O5, Al2O3, or other material having suitable insulating properties. The deposition of insulating layer 116 may involve spin coating, PVD, CVD, printing, sintering, or thermal oxidation. A portion of insulating layer 116 is removed to expose conductive layers 114a, 114c, and 114i.

An electrically conductive solder material is deposited over conductive layer 114a, 114c, and 114i using an evaporation, electrolytic plating, electroless plating, ball drop, or screen printing process. The solder material can be any metal or other electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 118. In some applications, solder bumps 118 are reflowed a second time to improve electrical contact to conductive layer 114. Solder bumps 118 represent one type of interconnect structure that can be formed on conductive layer 114. The interconnect structure can also use bond wires, 3D interconnects, conductive paste, or other electrical interconnect.

The semiconductor wafer 100 is singulated with saw blade or laser tool into individual IPD structures 121, each with a high resistivity substrate 104. The structures described in FIG. 3a, e.g., the combination of conductive layer 106, resistive layer 108, insulating layer 110, and conductive layer 114, constitute one or more passive circuit elements or IPDs. In one embodiment, conductive layer 106b, resistive layer 108b, insulating layer 110, and conductive layer 114b is a metal-insulator-metal (MIM) capacitor. Resistive layer 108a is a resistor element in the passive circuit. The conductive layers 114d-114h constitute an inductor. The conductive layers 114d-114h are typically wound or coiled in plan-view to produce or exhibit the desired inductive properties.

The pre-fabricated IPD structure 121 provides electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions. However, high frequency electrical devices generate or are susceptible to undesired electromagnetic interference (EMI), radio frequency interference (RFI), or other inter-device interference, such as capacitive, inductive, or conductive coupling, also known as cross-talk.

FIG. 3b shows an embodiment with adhesive layer 120 formed over insulating layer 116 and contacting conductive layer 114a, 114c, and 114i. The adhesive layer 120 provides for later attachment of semiconductor layers or electrical components.

Figure 4D:
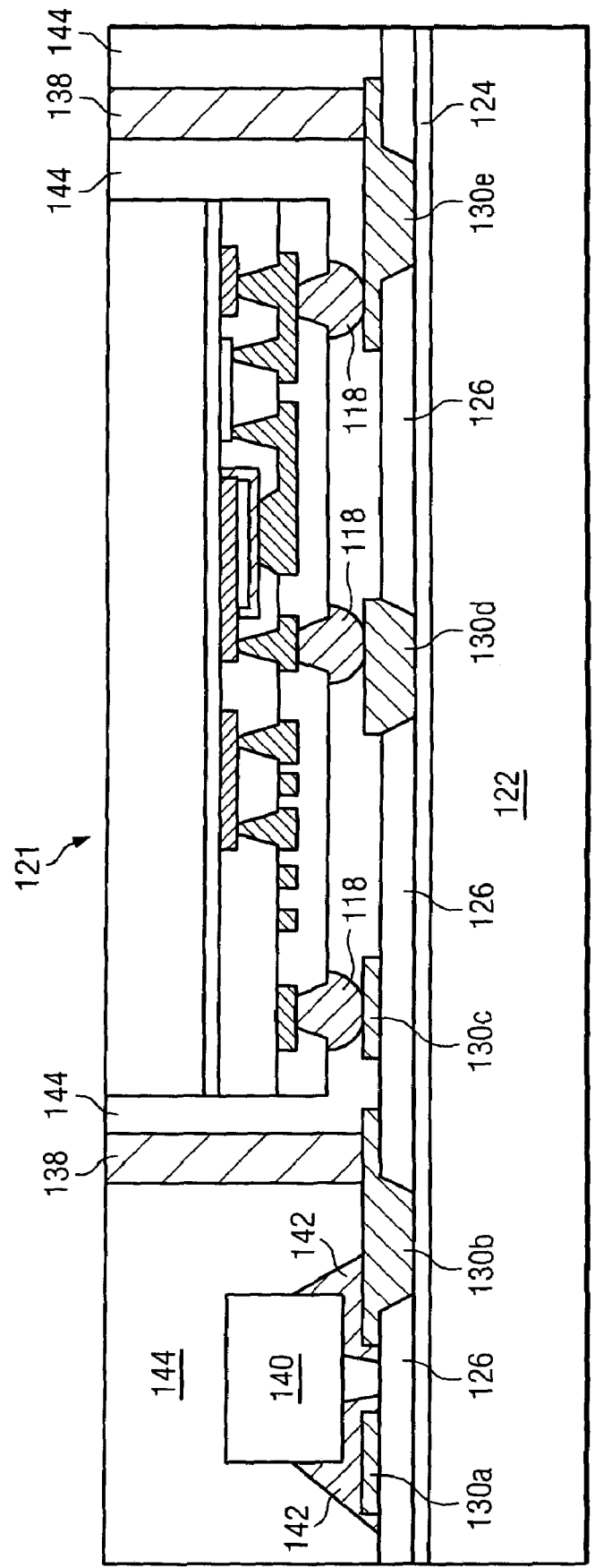

FIGS. 4a-4e illustrate a process of forming a semiconductor package having an embedded IPD structure electrically interconnected on the package using conductive pillars. In particular, FIG. 4a shows a first passivation layer 124 formed on substrate or carrier 122. Carrier 122 is a temporary or sacrificial base material such as silicon, ceramic, glass, or other suitable low-cost, rigid material. Passivation layer 124 can be SiO2, Si3N4, SiON, Ta2O5, ZrO2, Al2O3, polyimide, BCB, PBO, or other material having suitable insulating properties. Passivation layer 124 is patterned or blanket deposited using PVD, CVD, printing, spin coating, sintering, or thermal oxidation. Passivation layer 124 is optional, provides stress relief, and operates as an etch stop.

A second passivation layer 126 is formed on passivation layer 124. Passivation layer 126 can be SiO2, Si3N4, SiON, Ta2O5, ZrO2, Al2O3, polyimide, BCB, PBO, or other material having suitable insulating properties. Passivation layer 126 is patterned or blanket deposited using PVD, CVD, printing, spin coating, sintering, or thermal oxidation. Passivation layers 124 and 126 can be formed as one passivation layer. A portion of passivation layer 126 is removed to form vias 128.

An electrically conductive layer 130 is patterned and deposited over passivation layers 124 and 126 to form individual portions or sections 130a-130e. The individual portions of conductive layer 130 can be electrically common or electrically isolated depending on the connectivity of the individual semiconductor die formed on carrier 122. Accordingly, conductive layer 130 constitutes an interconnect structure.

Further detail of via 128 in passivation layer 126 is shown in FIG. 4b. Via 128 is filled with an adhesive layer 132. A barrier layer 134 is formed over adhesive layer 132. Conductive layer 130 is formed over barrier layer 134. In another embodiment shown in FIG. 4c, via 128 is filled with an adhesive layer 132. A barrier layer 134 is formed over adhesive layer 132. Barrier layer 134 is optional. A seed layer 136 is formed over barrier layer 134. Conductive layer 130 is formed over seed layer 136. In one embodiment, conductive layer 130 is stacked Ti/NiV/Cu or Al/NiV/Cu with Ti or AL as an adhesive layer, nickel vanadium (NiV) as a barrier layer, and Cu as a seed layer. Alternately, conductive layer 130 can be Al, Cu, Sn, Ni, Au, Ag, or other suitable material with optional adhesion and barrier layers containing titanium (Ti), titanium tungsten (TiW), titanium nitride (TiN), tantalum (Ta), or tantalum nitride (TaN). The deposition of conductive layer 130 uses PVD, CVD, electrolytic plating, or electroless plating process. Conductive layer 130 operates as ground plane, as well as an electrical interconnect.

Returning to FIG. 4a, conductive pillars or posts 138 are formed over conductive layer 130. Conductive pillars 138 can be Cu, Al, tungsten (W), Au, solder, or other suitable material. To form conductive pillars, a thick layer of photoresist, e.g., 100-200 μm, is deposited over insulating layer 126 and conductive layer 130. The photoresist can be a liquid or a dry film. Two layers of photoresist may be applied to achieve the desired thickness. The photoresist is patterned and metal is deposited in the patterned areas of the photoresist using PVD, CVD, electrolytic plating, or electroless plating process. The photoresist is stripped away leaving behind individual conductive pillars 138. In another embodiment, the conductive pillars 138 can be implemented with solder balls or stud bumps.

FIG. 4d shows the pre-fabricated IPD structure 121 from FIG. 3a inverted with solder bumps 118 mounted to conductive layers 130c, 130d, and 130e between conductive pillars 138. IPD structure 121 is self-aligning during solder reflow for high registration. A semiconductor device 140 is mounted to conductive layer 130a-130b using electrical connections 142, e.g., solder bumps, metal bonding, or conductive paste. Semiconductor device 140 can be a passive circuit component, such as a large-value capacitor (>1 nanofarad), or base-band digital circuit, such as digital signal processor (DSP), memory, or other signal processing circuit. Note that a top surface of conductive pillar 138 and IPD structure 121 have about the same height. Alternatively, if conductive pillar 138 and IPD structure 121 have different heights, then IPD structure 121 is typically made higher. In other embodiments, conductive pillars 138 are higher than IPD structure 121.

An encapsulant or molding compound 144 is deposited over the IPD structure, between conductive pillars 138, and around semiconductor device 140 using a printing, compressive molding, transfer molding, liquid encapsulant molding, or other suitable applicator. Encapsulant 144 extends to a top surface of conductive pillars 138. Encapsulant 144 can be epoxy resin, epoxy acrylate, polymer, or polymer composite material. Encapsulant 144 is non-conductive and environmentally protects the semiconductor device from external elements and contaminants. Encapsulant 144 has a coefficient of thermal expansion (CTE) that is adjusted to match that of the base semiconductor material, e.g., silicon, with a glass transition temperature (Tg) greater than 100° C. The CTE of encapsulant 144 can be adjusted using a filler such as a powder, fiber, or cloth additive. A suitable encapsulant material is generally characterized by low-shrinkage, high-resistivity of greater than 1.0 kohm-cm, low-dielectric constant of less than 4, and low-loss tangent of less than 0.05 in 500 MHz to 30 GHz range. Encapsulant 144 undergoes grinding or etch-back to expose conductive pillars 138.

Figure 4E:
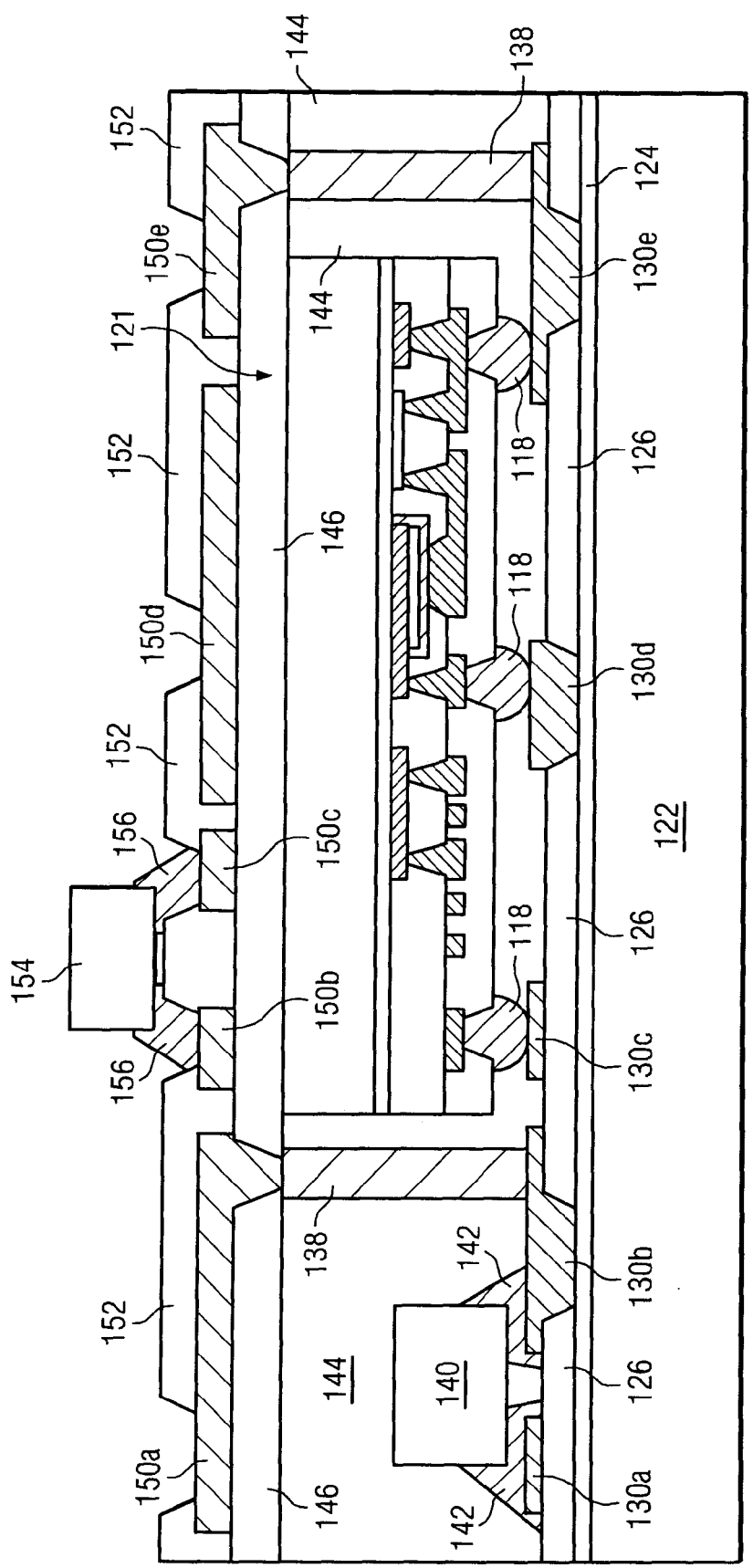

In FIG. 4e, an insulating layer 146 is formed over conductive pillars 138, encapsulant 144, and IPD structure 121. In one embodiment, insulating layer 146 is a passivation layer of SiO2, Si3N4, SiON, Ta2O5, ZrO2, Al2O3, polyimide, BCB, PBO, or other material having suitable insulating properties. The insulating layer 146 is patterned or blanket deposited using PVD, CVD, printing, spin coating, sintering, or thermal oxidation. A portion of insulating layer 146 is removed using an etching process to expose conductive pillars 138.

An electrically conductive layer 150 is formed over insulating layer 146 and conductive pillars 138 using a patterning and deposition process to form individual portions or sections 150*a*-150*e*. The individual portions of conductive layer 150 can be electrically common or electrically isolated depending on the connectivity of the individual semiconductor die formed on carrier 122. Accordingly, conductive layer 150 constitutes an interconnect structure. Conductive layer 150 can be Al, Cu, Sn, Ni, Au, Ag, or other suitable material. The deposition of conductive layer 150 uses PVD, CVD, electrolytic plating, or electroless plating process. Conductive layer 150*a* and 150*e* electrically connect to conductive pillars 138. Conductive layer 150 provides EMI and RFI protection for IPD structure 121, as well as package interconnection.

An insulating layer 152 is formed over insulating layer 146 and conductive layer. The insulating layer 152 can be Si3N4, SiO2, SiON, Ta2O5, ZnO, ZrO2, Al2O3, or other suitable insulating material. The insulating layer 152 is patterned or blanket deposited using PVD, CVD, printing, spin coating, sintering, or thermal oxidation.

A semiconductor device 154 is mounted to conductive layer 150*b*-150*c* using electrical connections 156, e.g., solder bumps, metal bonding, or conductive paste. Semiconductor device 154 is typically mounted on a system-in-package (SiP) module in a printed circuit board (PCB) assembly after singulation. Semiconductor device 154 can be a passive circuit component, such as a large-value capacitor (>1 nF), or baseband digital circuit, such as DSP, memory, or other signal processing circuit. Semiconductor devices 140 and 154 can be integrated on the same device as thin film IPD structure 121 to save package area.

Figure 5:
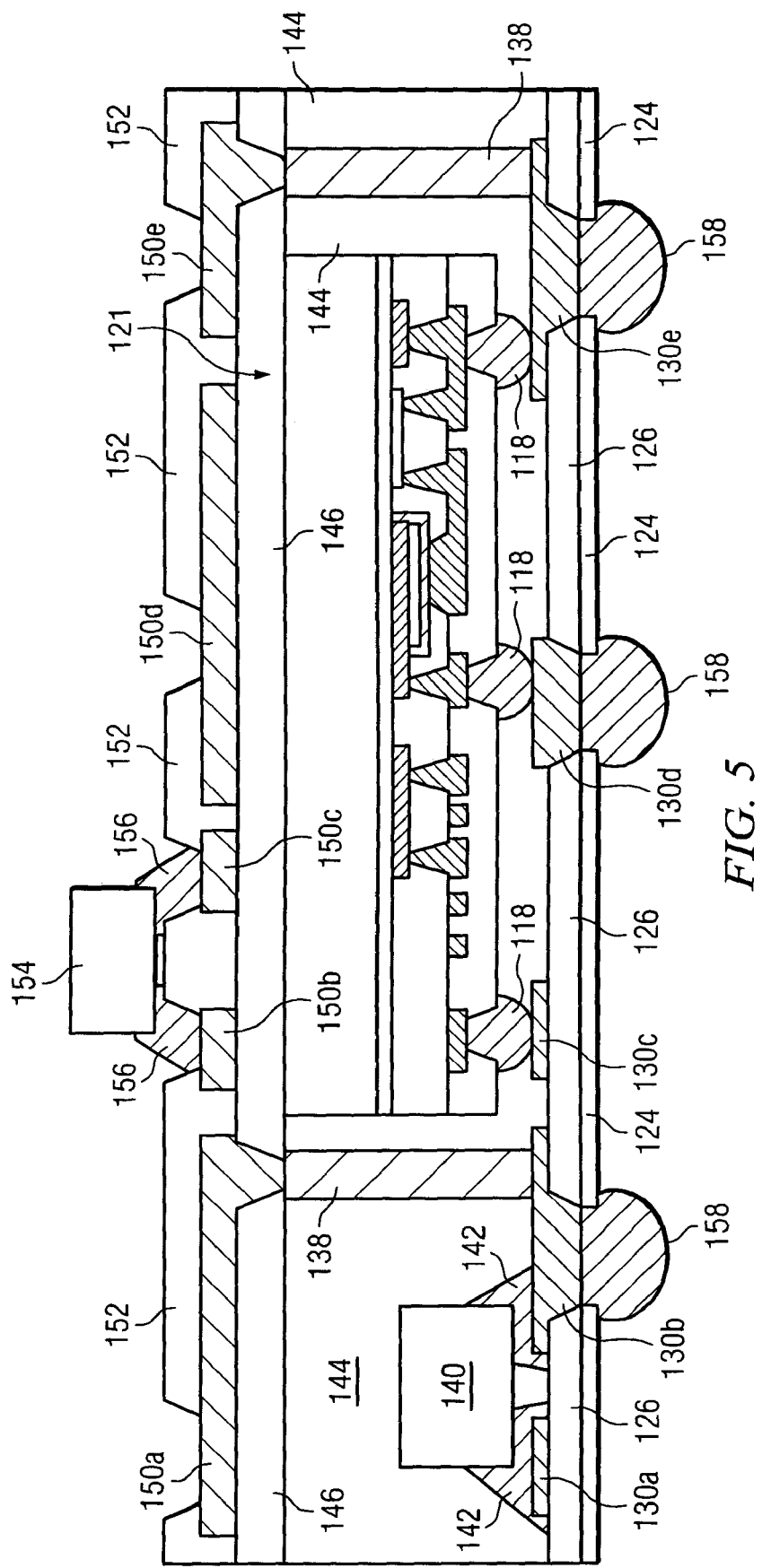
FIG. 5 illustrates the IPD electrically interconnected using conductive pillars.

FIG. 5 shows the semiconductor device following removal of sacrificial carrier 122 by mechanical back grinding, CMP, wet etching, or dry etching. Passivation 124 is used as a hard mark or etch stop to open adhesion layer 132 and barrier layer 134 and expose conductive layer 130 for wetting. A portion of passivation layer 124 is removed to expose conductive layer 130. Alternatively, passivation layer 124 can be blanket-etched with good selectivity to passivation layer 126. The adhesion layer and barrier layer in 130 are later etched with good selectivity on passivation layer 126. Conductive layer 130*b*, 130*d*, and 130*e* operate as under bump metallization (UBM).

An electrically conductive solder material is deposited over conductive layer 130*b*, 130*d*, and 130*e* using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. The solder material is reflowed by heating the material above its melting point to form spherical balls or bumps 158. Solder bumps 158 represent one type of interconnect structure that can be formed on conductive layer 130. The interconnect structure can also use bond wires, 3D interconnects, conductive paste, or other electrical interconnect.

Accordingly, conductive pillars 138 provide electrical interconnect vertically between the passive circuit elements contained in IPD structure 121 and other semiconductor layers and devices within the package. The passive circuit elements contained in IPD structure 121 electrically connect through conductive pillars 138 and conductive layer 130 to semiconductor device 140, as well as other external devices through solder bumps 158. Likewise, the passive circuit elements contained in IPD structure 121 electrically connect through conductive pillars 138 and conductive layers 130 and 150 to semiconductor device 154.

Figure 6:
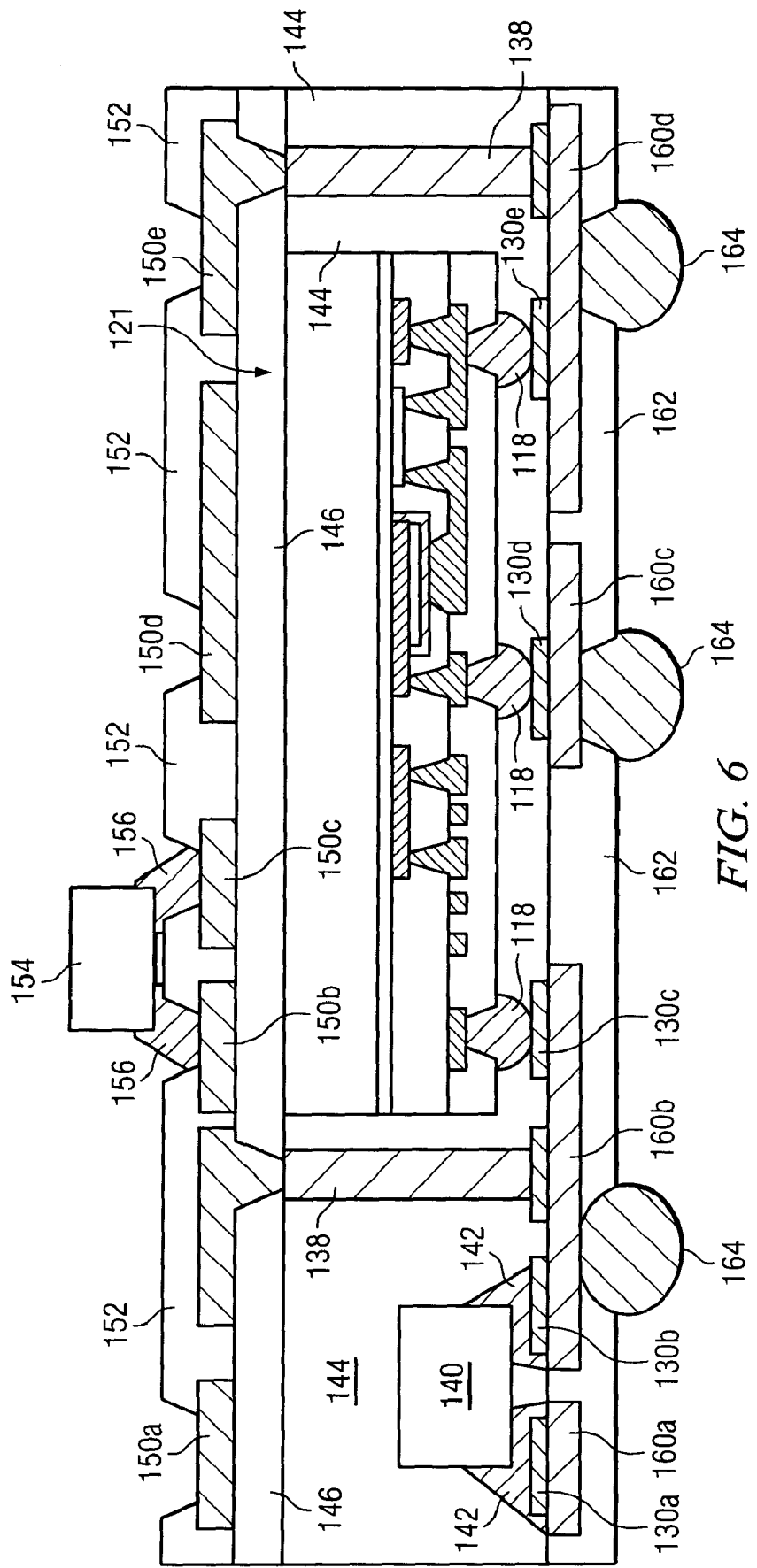
FIG. 6 illustrates another embodiment of the IPD electrically interconnected using conductive pillars.

FIG. 6 shows a similar semiconductor device as FIG. 5 with an electrically conductive layer 160 patterned and deposited over conductive layer 130 to form individual portions or sections 160*a*-160*d*. Alternatively, the carrier can be temporary carrier, without first and second insulation layers. The temporary carrier is released with either thermal or ultraviolet (UV) method after the process of the second interconnection structure after encapsulation. The individual portions of conductive layer 160 can be electrically common or electrically isolated depending on the connectivity of the individual semiconductor die. Conductive layer 160 can be Al, Cu, Sn, Ni, Au, Ag, or other suitable electrically conductive material. The deposition of conductive layer 160 uses PVD, CVD, electrolytic plating, or electroless plating process. Conductive layer 160 operates as ground plane, as well as an electrical interconnect.

An insulating layer 162 is formed over conductive layer 160. The insulating layer 162 can be SiO2, Si3N4, SiON, Ta2O5, Al2O3, or other material having suitable insulating properties. The deposition of passivation layer 162 may involve spin coating, PVD, CVD, printing, sintering, or thermal oxidation. A portion of insulating layer 162 is removed to expose conductive layers 160*b*, 160*c*, and 160*d*.

An electrically conductive solder material is deposited over conductive layer 160*b*, 160*c*, and 160*d* using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. The solder material is reflowed by heating the material above its melting point to form spherical balls or bumps 164. Solder bumps 164 represent one type of interconnect structure that can be formed on conductive layer 160. The interconnect structure can also use bond wires, 3D interconnects, conductive paste, or other electrical interconnect.

The conductive pillars 138 provide electrical interconnect vertically between the passive circuit elements contained in IPD structure 121 and other semiconductor layers and devices within the package. The passive circuit elements contained in IPD structure 121 electrically connect through conductive pillars 138 and conductive layers 130 and 160 to semiconductor device 140, as well as other external devices through solder bumps 164. Likewise, the passive circuit elements contained in IPD structure 121 electrically connect through conductive pillars 138 and conductive layers 130 and 150 to semiconductor device 154.

Figure 7:
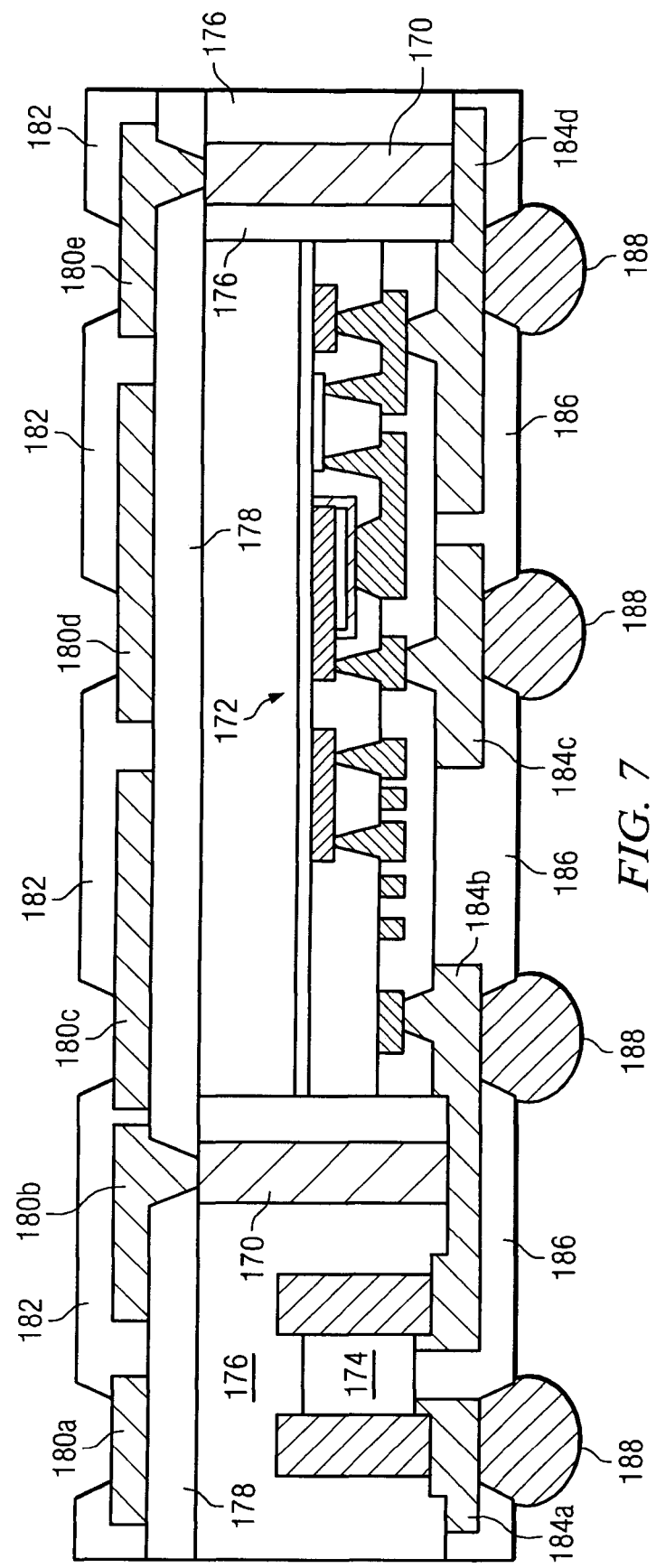
FIG. 7 illustrates another embodiment of the IPD electrically interconnected using conductive pillars.

In FIG. 7, conductive pillars or posts 170 are formed over a sacrificial or temporary carrier similar to conductive pillars 138 in FIG. 4*a*. Next, a pre-fabricated IPD structure 172, similar to FIG. 3*a* but without solder bumps 118, is inverted and mounted to the sacrificial carrier between conductive pillars 170 with die attach adhesive. A semiconductor device 174 is also mounted to the sacrificial carrier with die attach adhesive. Semiconductor device 174 can be a passive circuit component, such as a capacitor, or baseband digital circuit, such as DSP, memory, or other signal processing circuit.

An encapsulant or molding compound 176 is deposited over the IPD structure, between conductive pillars 170, and around semiconductor device 174 using a printing, compressive molding, transfer molding, liquid encapsulant molding, or other suitable applicator. Encapsulant 176 extends to a top surface of conductive pillars 170. Encapsulant 176 can be epoxy resin, epoxy acrylate, polymer, or polymer composite material. Encapsulant 176 is non-conductive and environmentally protects the semiconductor device from external elements and contaminants. Encapsulant 176 undergoes grinding or etch-back to expose conductive pillars 170.

An insulating layer 178 is formed over conductive pillars 170, encapsulant 176, and IPD structure 172. In one embodiment, insulating layer 178 is a passivation layer of SiO2, Si3N4, SiON, Ta2O5, ZrO2, Al2O3, polyimide, BCB, PBO, or other material having suitable insulating properties. The insulating layer 178 is patterned or blanket deposited using PVD, CVD, printing, spin coating, sintering, or thermal oxidation. A portion of insulating layer 178 is removed using an etching process to expose conductive pillars 170.

An electrically conductive layer 180 is formed over insulating layer 178 and conductive pillars 170 using a patterning and deposition process to form individual portions or sections 180a-180e. The individual portions of conductive layer 180 can be electrically common or electrically isolated depending on the connectivity of the individual semiconductor die. Accordingly, conductive layer 180 constitutes an interconnect structure. Conductive layer 180 can be Al, Cu, Sn, Ni, Au, Ag, or other suitable material. The deposition of conductive layer 180 uses PVD, CVD, electrolytic plating, or electroless plating process. Conductive layer 180b and 180e electrically connect to conductive pillars 170. Conductive layer 180 provides EMI and RFI protection for IPD structure 172, as well as package interconnection.

An insulating layer 182 is formed over insulating layer 178 and conductive layer 180 using a patterning and deposition process. Alternatively, insulating layer 182 can be blanket deposited with any patterning. The insulating layer 182 can be epoxy matrix polymer, Si3N4, SiO2, SiON, Ta2O5, ZnO, ZrO2, Al2O3, or other suitable insulating material. The insulating layer 182 is patterned or blanket deposited using PVD, CVD, printing, spin coating, sintering, or thermal oxidation.

The sacrificial or temporary carrier is removed by mechanical back grinding, CMP, wet etching, dry etching, or thermal/light releasing process. Die attach adhesive is removed by typical wet solvent or thermal/UV light releasing together with mechanical peeling assisted by peeling tape. An electrically conductive layer 184 is patterned and deposited over encapsulant 176, IPD structure 172, conductive pillars 170, and semiconductor device 174 to form individual portions or sections 184a-184d. The individual portions of conductive layer 184 can be electrically common or electrically isolated depending on the connectivity of the individual semiconductor die. Accordingly, conductive layer 184 constitutes an interconnect structure. Conductive layer 184 can be Al, Cu, Sn, Ni, Au, Ag, or other suitable electrically conductive material. The deposition of conductive layer 184 uses PVD, CVD, electrolytic plating, or electroless plating process. Conductive layer 184 operates as ground plane, as well as an electrical interconnect.

An insulating layer 186 is formed over conductive layer 184. The insulating layer 186 can be SiO2, Si3N4, SiON, Ta2O5, Al2O3, polyimide, BCB, PBO, or other material having suitable insulating properties. The deposition of passivation layer 186 may involve spin coating, PVD, CVD, printing, sintering, or thermal oxidation. A portion of insulating layer 186 is removed to expose conductive layers 184b, 184c, and 184d.

An electrically conductive solder material is deposited over conductive layer 184b, 184c, and 184d using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. The solder material is reflowed by heating the material above its melting point to form spherical balls or bumps 188. Solder bumps 188 represent one type of interconnect structure that can be formed on conductive layer 184. The interconnect structure can also use bond wires, 3D interconnects, conductive paste, or other electrical interconnect.

Accordingly, conductive pillars 170 provide electrical interconnect vertically between the passive circuit elements contained in IPD structure 172 and other semiconductor layers and devices within the package. The passive circuit elements contained in IPD structure 172 electrically connect through conductive pillars 170 and conductive layer 184 to semiconductor device 174, as well as other external devices through solder bumps 188.

Figure 8:
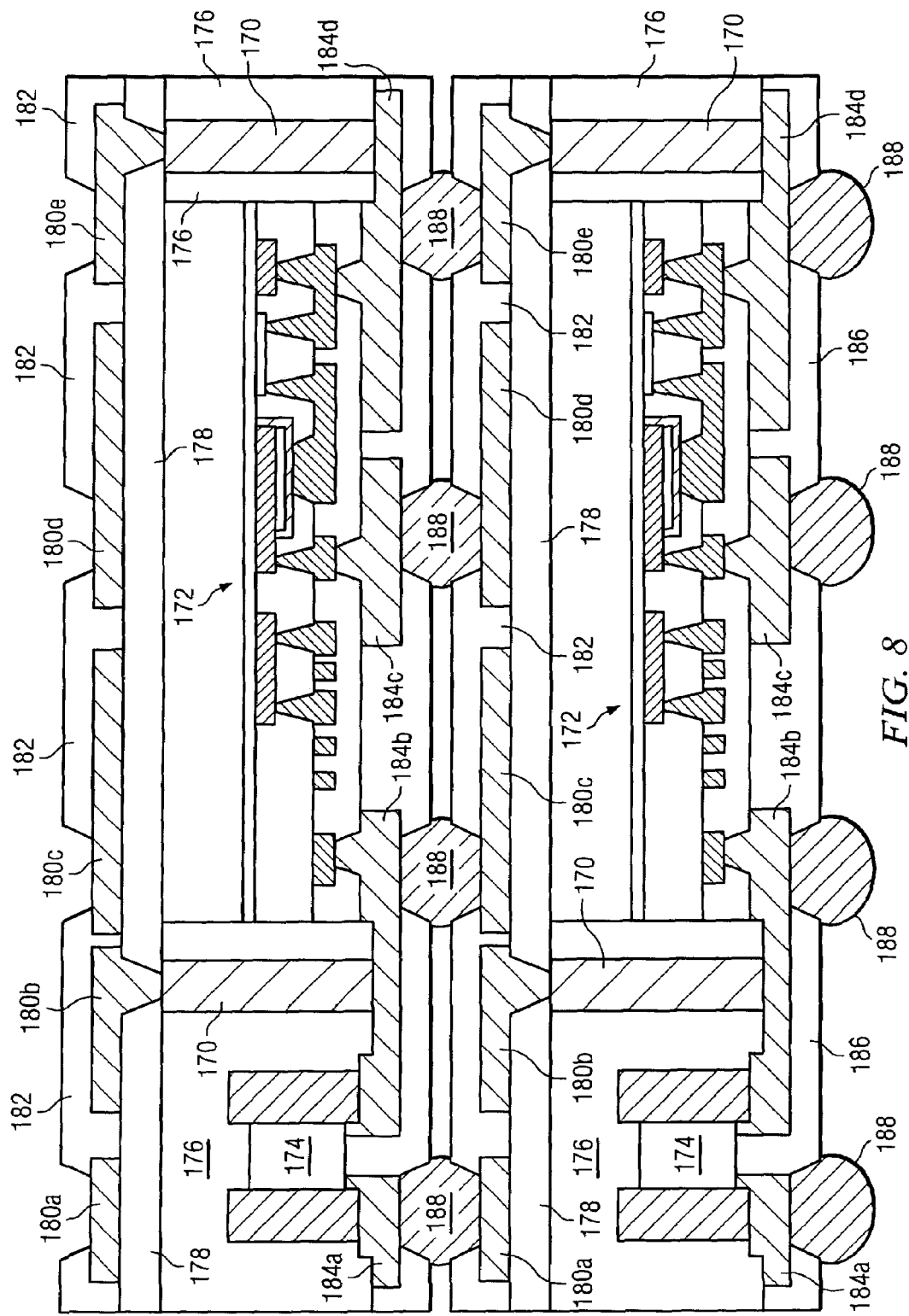
FIG. 8 illustrates stacked semiconductor devices.

FIG. 8 illustrates two stacked semiconductor packages, similar to the devices shown in FIG. 7. Conductive pillars 170 provide vertical electrical interconnect between the passive circuit elements contained in IPD structure 172 and other semiconductor layers and devices within the package. The passive circuit elements contained in IPD structure 172 electrically connect through conductive pillars 170 and conductive layer 184 to semiconductor device 174, as well as stacked devices through solder bumps 188.

Figure 9:
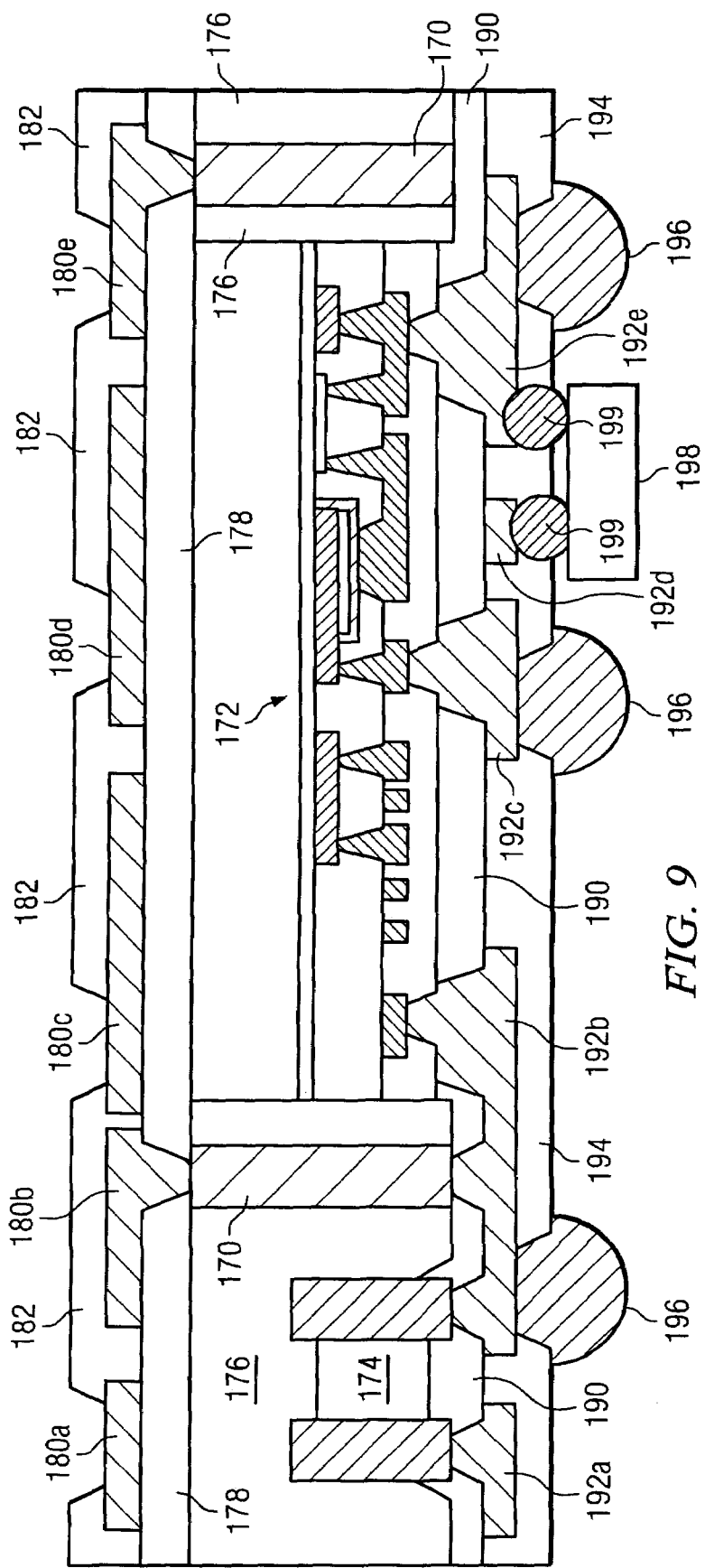
FIG. 9 illustrates the IPD electrically interconnected using conductive pillars with additional front-side semiconductor die or component.

FIG. 9 has similar features as the device shown in FIG. 7 with the addition of insulating layer 190 formed over conductive pillars 170, encapsulant 176, and IPD structure 172. In one embodiment, insulating layer 190 is a passivation layer of SiO2, Si3N4, SiON, Ta2O5, ZrO2, Al2O3, polyimide, BCB, PBO, or other material having suitable insulating properties. The insulating layer 190 is patterned or blanket deposited using PVD, CVD, printing, spin coating, sintering, or thermal oxidation. A portion of insulating layer 190 is removed using an etching process to expose conductive pillars 170.

An electrically conductive layer 192 is formed over insulating layer 190 and conductive pillars 170 using a patterning and deposition process to form individual portions or sections 192a-192e. The individual portions of conductive layer 192 can be electrically common or electrically isolated depending on the connectivity of the individual semiconductor die. Accordingly, conductive layer 192 constitutes an interconnect structure. Conductive layer 192 can be Al, Cu, Sn, Ni, Au, Ag, or other suitable material. The deposition of conductive layer 192 uses PVD, CVD, electrolytic plating, or electroless plating process. Conductive layer 192b and 192e electrically connect to conductive pillars 170. Conductive layer 192 provides EMI and RFI protection for IPD structure 172, as well as package interconnection.

An insulating layer 194 is formed over conductive layer 192. The insulating layer 194 can be SiO2, Si3N4, SiON, Ta2O5, Al2O3, polyimide, BCB, PBO, or other material having suitable insulating properties. The deposition of passivation layer 194 may involve spin coating, PVD, CVD, printing, sintering, or thermal oxidation. A portion of insulating layer 194 is removed to expose conductive layers 192b, 192c, 192d, and 192e.

An electrically conductive solder material is deposited over conductive layer 192b, 192c, and 192d using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. The solder material is reflowed by heating the material above its melting point to form spherical balls or bumps 196. Solder bumps 196 represent one type of interconnect structure that can be formed on conductive layer 192. The interconnect structure can also use bond wires, 3D interconnects, conductive paste, or other electrical interconnect.

A semiconductor device 198 is mounted to conductive layer 192d-192e using electrical connections 199, e.g., solder bumps, metal bonding, or conductive paste. Semiconductor device 198 can be a passive circuit component, such as a large-value capacitor, or baseband digital circuit, such as DSP, memory, or other signal processing circuit.

Accordingly, conductive pillars 170 provide electrical interconnect vertically between the passive circuit elements contained in IPD structure 172 and other semiconductor layers and devices within the package. The passive circuit elements contained in IPD structure 172 electrically connect through conductive pillars 170 and conductive layer 192 to semiconductor devices 174 and 198, as well as other external devices through solder bumps 196.

Figure 10:
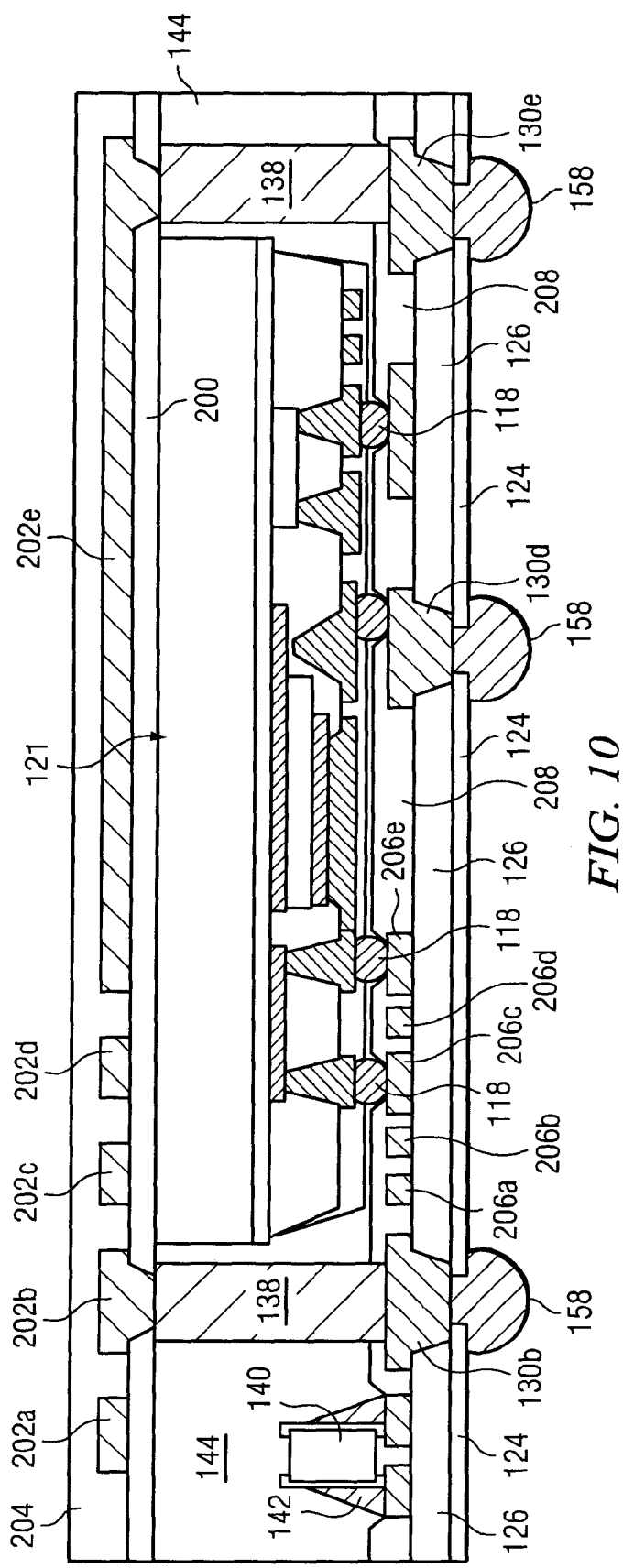
FIG. 10 illustrates the IPD electrically interconnected using conductive pillars with an inductor formed in the conductive layers.

FIG. 10 shows a similar semiconductor device as FIG. 5 with an insulating layer 200 formed over conductive pillars 138, encapsulant 144, and IPD structure 121. In one embodiment, insulating layer 200 is a passivation layer formed with SiO2, Si3N4, SiON, Ta2O5, ZrO2, Al2O3, polyimide, BCB, PBO, or other material having suitable insulating properties. The insulating layer 200 is patterned or blanket deposited using PVD, CVD, printing, spin coating, sintering, or thermal oxidation. A portion of insulating layer 200 is removed using an etching process to expose conductive pillars 138.

An electrically conductive layer 202 is formed over insulating layer 200 and conductive pillars 138 using a patterning and deposition process to form individual portions or sections 202a-202d. The individual portions of conductive layer 202 can be electrically common or electrically isolated depending on the connectivity of the individual semiconductor die. Accordingly, conductive layer 202 constitutes an interconnect structure. Conductive layer 202 can be Al, Cu, Sn, Ni, Au, Ag, or other suitable material. The deposition of conductive layer 202 uses PVD, CVD, electrolytic plating, or electroless plating process. Conductive layer 202b and 202d electrically connect to conductive pillars 138. Conductive layer 202a-202e operates as an inductor with the layer wound or coiled in plan-view to produce or exhibit the desired inductive properties.

An insulating layer 204 is formed over insulating layer 200 and conductive layer 202 using a patterning and deposition process. The insulating layer 204 can be epoxy matrix polymer, Si3N4, SiO2, SiON, Ta2O5, ZnO, ZrO2, Al2O3, or other suitable insulating material. The insulating layer 204 is patterned or blanket deposited using PVD, CVD, printing, spin coating, sintering, or thermal oxidation.

An electrically conductive layer 206 is formed over insulating layer 126 using a patterning and deposition process to form individual portions or sections 206a-206e. Conductive layer 206 can be Al, Cu, Sn, Ni, Au, Ag, or other suitable material. The deposition of conductive layer 206 uses PVD, CVD, electrolytic plating, or electroless plating process. Conductive layer 206a-206e operates as an inductor with the layer wound or coiled in plan-view to produce or exhibit the desired inductive properties.

An insulating layer 208 is formed over insulating layer 126 and conductive layer 206 using a patterning and deposition process. The insulating layer 208 can be Si3N4, SiO2, SiON, Ta2O5, ZnO, ZrO2, Al2O3, or other suitable insulating material. The insulating layer 208 is patterned or blanket deposited using PVD, CVD, printing, spin coating, sintering, or thermal oxidation.

Conductive pillars 138 provide electrical interconnect vertically between the passive circuit elements contained in IPD structure 121 and other semiconductor layers and devices within the package. The passive circuit elements contained in IPD structure 121 electrically connect through conductive pillars 138 and conductive layer 130 to semiconductor device 140, as well as other external devices through solder bumps 158. Likewise, the passive circuit elements contained in IPD structure 121 electrically connect through conductive pillars 138 to the inductor formed by conductive layer 202.

Figure 11:
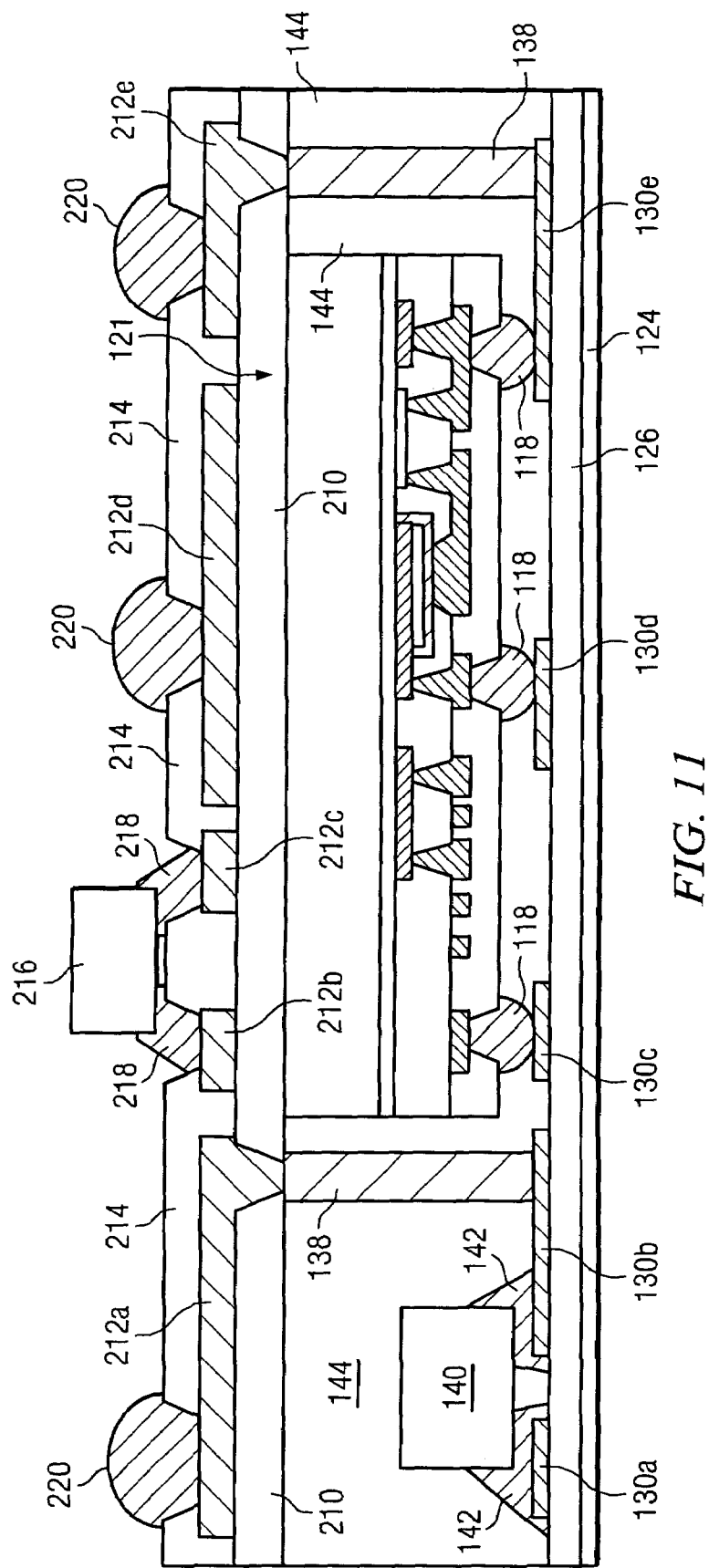
FIG. 11 illustrates the IPD electrically interconnected using conductive pillars with a front-side external interconnect structure.

FIG. 11 shows a semiconductor device similar to the device of FIG. 5 with package interconnect provided only on the front side of the package. An insulating layer 210 is formed over conductive pillars 138, encapsulant 144, and IPD structure 121. In one embodiment, insulating layer 210 is a passivation layer formed with SiO2, Si3N4, SiON, Ta2O5, ZrO2, Al2O3, polyimide, BCB, PBO, or other material having suitable insulating properties. The insulating layer 210 is patterned or blanket deposited using PVD, CVD, printing, spin coating, sintering, or thermal oxidation. A portion of insulating layer 210 is removed using an etching process to expose conductive pillars 138.

An electrically conductive layer 212 is formed over insulating layer 210 and conductive pillars 138 using a patterning and deposition process to form individual portions or sections 212a-212e. The individual portions of conductive layer 212 can be electrically common or electrically isolated depending on the connectivity of the individual semiconductor die. Accordingly, conductive layer 212 constitutes an interconnect structure. Conductive layer 212 can be Al, Cu, Sn, Ni, Au, Ag, or other suitable material. The deposition of conductive layer 212 uses PVD, CVD, electrolytic plating, or electroless plating process. Conductive layer 212a and 212e electrically connect to conductive pillars 138. Conductive layer 212 provides EMI and RFI protection for IPD structure 121, as well as package interconnection.

An insulating layer 214 is formed over insulating layer 210 and conductive layer 212 using a patterning and deposition process. The insulating layer 214 can be epoxy matrix polymer, Si3N4, SiO2, SiON, Ta2O5, ZnO, ZrO2, Al2O3, or other suitable insulating material. The insulating layer 214 is patterned or blanket deposited using PVD, CVD, printing, spin coating, sintering, or thermal oxidation.

A semiconductor device 216 is mounted to conductive layer 212b-212c using electrical connections 218, e.g., solder bumps, metal bonding, or conductive paste. Semiconductor device 212 can be a passive circuit component, such as a capacitor, or baseband digital circuit, such as DSP, memory, or other signal processing circuit.

An electrically conductive solder material is deposited over conductive layer 212a, 212d, and 212e using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. The solder material is reflowed by heating the material above its melting point to form spherical balls or bumps 220. Solder bumps 220 represent one type of interconnect structure that can be formed on conductive layer 212. The interconnect structure can also use bond wires, 3D interconnects, conductive paste, or other electrical interconnect.

Accordingly, conductive pillars 138 provide electrical interconnect vertically between the passive circuit elements contained in IPD structure 121 and other semiconductor layers and devices within the package. The passive circuit elements contained in IPD structure 121 electrically connect through conductive pillars 138 and conductive layer 212 to semiconductor device 216, as well as other external devices through solder bumps 220.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
   providing a prefabricated integrated passive device (IPD) by,
      forming a metal-insulator-metal capacitor over a first substrate,
      forming an inductor as a wound conductive layer over the first substrate, and
      forming a resistor over the first substrate;
   providing a sacrificial substrate;
   forming a first insulation layer over the sacrificial substrate;
   forming a first conductive layer over the first insulating layer;
   forming a plurality of conductive pillars over the first conductive layer and directly connected to the first conductive layer;
   after forming the conductive pillars, mounting the prefabricated IPD to the first conductive layer such that the prefabricated IPD is disposed between the conductive pillars, the prefabricated IPD being self-aligned to the first conductive layer;
   mounting a discrete capacitor having a value greater than one nanofarad over the first conductive layer, the discrete capacitor being electrically connected to one of the conductive pillars;
   forming an encapsulant around the prefabricated IPD, discrete capacitor, and conductive pillars;
   forming a second insulation layer over the encapsulant;
   forming a second conductive layer over the second insulating layer, the second conductive layer being electrically connected to the conductive pillars; and
   removing the sacrificial substrate.

2. The method of claim 1, further including:
   forming a third insulation layer over the second conductive layer and second insulating layer; and
   mounting a semiconductor device over third insulating layer, the semiconductor device being electrically connected to the second conductive layer and conductive pillars.

3. The method of claim 2, wherein the semiconductor device includes a passive device or digital circuit.

4. The method of claim 1, wherein the first or second conductive layer includes an inductor.

5. The method of claim 1, further including forming an interconnect structure over the first insulating layer, the interconnect structure being electrically connected to the first conductive layer and conductive pillars.

6. The method of claim 1, further including:
   stacking a plurality of the semiconductor devices; and
   electrically interconnecting the stacked semiconductor devices through the conductive pillars.

7. A method of manufacturing a semiconductor device, comprising:
   providing a prefabricated integrated passive device (IPD) by,
      forming a metal-insulator-metal capacitor over a first substrate, and
      forming an inductor as a wound conductive layer over the first substrate;
   providing a temporary substrate;
   forming a first conductive layer over the temporary substrate;
   forming a plurality of conductive pillars over the first conductive layer directly contacting the first conductive layer;
   after forming the conductive pillars, mounting the prefabricated IPD to the first conductive layer such that the prefabricated IPD is disposed between the conductive pillars, the prefabricated IPD being self-aligned to the first conductive layer;
   mounting a discrete capacitor over the first conductive layer, the discrete capacitor being electrically connected to one of the conductive pillars;
   forming an encapsulant around the prefabricated IPD, discrete capacitor, and conductive pillars;
   forming a first insulation layer over the encapsulant and conductive pillars;
   forming a second conductive layer over the first insulating layer, the second conductive layer being electrically connected to the conductive pillars; and
   removing the temporary substrate.

8. The method of claim 7, further including:
   forming a third conductive layer over the first conductive layer; and
   forming a second insulation layer over the third conductive layer.

9. The method of claim 7, wherein the first or second conductive layer includes an inductor.

10. The method of claim 7, further including mounting a semiconductor device over the second conductive layer, the semiconductor device being electrically connected to the conductive pillars.

11. The method of claim 7, further including forming an interconnect structure over the first conductive layer, the interconnect structure being electrically connected to the conductive pillars.

12. The method of claim 7, further including:
    stacking a plurality of the semiconductor devices; and
    electrically interconnecting the stacked semiconductor devices through the conductive pillars.

13. The method of claim 7, further including forming a second insulating layer between the first insulating layer and prefabricated IPD.

14. A method of manufacturing a semiconductor device, comprising:
    providing a prefabricated integrated passive device (IPD) by forming a metal-insulator-metal capacitor or an inductor as a wound conductive layer over a substrate;
    providing a first interconnect structure;
    forming a plurality of conductive pillars over the first interconnect structure, the conductive pillars directly contacting the first interconnect structure;
    mounting a discrete capacitor over the first interconnect structure, the discrete capacitor being electrically connected to one of the conductive pillars;
    after forming the conductive pillars, mounting the prefabricated IPD to the first interconnect structure between the conductive pillars, the prefabricated IPD being self-aligned to the first interconnect structure; and
    forming an encapsulant around the prefabricated IPD and conductive pillars.

15. The method of claim 14, further including:
    forming a second interconnect structure over the encapsulant; and
    mounting a semiconductor device over the second interconnect structure.

16. The method of claim 15, wherein the first or second interconnect structure includes an inductor.

17. The method of claim 14, further including:
  stacking a plurality of the semiconductor devices; and
  electrically interconnecting the stacked semiconductor devices through the conductive pillars.

18. A method of manufacturing a semiconductor device, comprising:
  forming a first interconnect structure;
  attaching a plurality of conductive pillars directly to the first interconnect structure;
  after attaching the conductive pillars to the first interconnect structure, mounting a prefabricated integrated passive device (IPD) to the first interconnect structure between the conductive pillars, the prefabricated IPD being self-aligned to the first interconnect structure; and
  mounting a discrete capacitor over the first interconnect structure, the discrete capacitor being electrically connected to one of the conductive pillars.

19. The method of claim 18, further including:
  forming a second interconnect structure over the encapsulant; and
  mounting a semiconductor device over the second interconnect structure.

20. The method of claim 19, wherein the first or second interconnect structure includes an inductor.

21. The method of claim 18, further including:
  stacking a plurality of the semiconductor devices; and
  electrically interconnecting the stacked semiconductor devices through the conductive pillars.

* * * * *